United States Patent
Corliss et al.

(10) Patent No.: US 10,642,161 B1
(45) Date of Patent: May 5, 2020

(54) BASELINE OVERLAY CONTROL WITH RESIDUAL NOISE REDUCTION

(71) Applicant: International Business Machines Corporation, Armonk, NY (US)

(72) Inventors: Daniel A. Corliss, Waterford, NY (US); Scott D. Halle, Slingerlands, NY (US); Richard C. Johnson, Selkirk, NY (US); Christopher F. Robinson, Hyde Park, NY (US); Chumeng Zheng, San Jose, CA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/156,227

(22) Filed: Oct. 10, 2018

(51) Int. Cl.
*G03F 7/20* (2006.01)

(52) U.S. Cl.
CPC ...... *G03F 7/70475* (2013.01); *G03F 7/70358* (2013.01); *G03F 7/70525* (2013.01); *G03F 7/70633* (2013.01)

(58) Field of Classification Search
CPC ............. G03F 7/70633; G03F 7/70525; G03F 7/70358; G03F 7/70475
See application file for complete search history.

(56) References Cited

U.S. PATENT DOCUMENTS

| | | | |
|---|---|---|---|
| 6,008,880 A | 12/1999 | Higashiki et al. | |
| 6,163,366 A * | 12/2000 | Okamoto | G03F 7/70458 355/53 |
| 6,266,144 B1 | 7/2001 | Li | |
| 6,694,498 B2 | 2/2004 | Conrad et al. | |
| 6,699,627 B2 | 3/2004 | Smith et al. | |
| 6,975,974 B2 | 12/2005 | Chien et al. | |
| 7,586,609 B2 | 9/2009 | Lin et al. | |
| 9,188,876 B2 | 11/2015 | Lee et al. | |
| 2002/0102482 A1* | 8/2002 | Smith | G03F 7/70558 430/22 |
| 2002/0105649 A1* | 8/2002 | Smith | G03F 7/70558 356/401 |
| 2003/0223630 A1* | 12/2003 | Adel | G03F 7/705 382/145 |
| 2005/0110969 A1* | 5/2005 | Mellinger | G03F 7/70625 355/53 |
| 2005/0188342 A1 | 8/2005 | Goodwin | |

(Continued)

*Primary Examiner* — Deoram Persaud
(74) *Attorney, Agent, or Firm* — Cantor Colburn LLP; Vazken Alexanian

(57) ABSTRACT

Systems, methods and computer program products generally include a vector by vector subtraction method per wafer. A first layer is exposed to form a pattern image on a wafer and the overlay data of alignment registration marks at multiple locations relative to alignment registration marks of a baseline reference are measured. The first layer is then reworked and exposed to form the same pattern image and the overlay data of alignment registration marks at multiple locations relative to alignment registration marks of a first layer are measured. The overlay data of the reworked first layer is subtracted from the overlay data of the first layer to provide an overlay difference at each of the multiple locations. The overlay difference is converted to a pre-correction factor of a magnitude opposite that of the overlay difference and is applied to exposure of a second layer provided on the first layer.

19 Claims, 7 Drawing Sheets

(56) References Cited

U.S. PATENT DOCUMENTS

| | | | |
|---|---|---|---|
| 2007/0009814 A1* | 1/2007 | Oesterholt | G03F 7/70508 430/30 |
| 2007/0072091 A1* | 3/2007 | Smith | G03F 7/70458 430/5 |
| 2008/0002875 A1* | 1/2008 | Do | G03F 7/70508 382/144 |
| 2008/0106714 A1* | 5/2008 | Okita | G03F 7/70633 355/53 |
| 2008/0165332 A1* | 7/2008 | Mos | G03F 7/70258 355/52 |
| 2008/0259297 A1* | 10/2008 | Kawakubo | G03F 7/70425 355/52 |
| 2012/0081682 A1* | 4/2012 | Ahn | G03B 27/521 355/67 |
| 2012/0227014 A1* | 9/2012 | Pforr | G03F 7/70633 716/52 |
| 2013/0201462 A1 | 8/2013 | Lee et al. | |
| 2015/0079700 A1* | 3/2015 | Ke | G03F 1/36 438/5 |
| 2015/0145151 A1 | 5/2015 | Van Der Schaar et al. | |
| 2015/0146188 A1* | 5/2015 | Lyulina | G03F 7/70633 355/77 |
| 2016/0062250 A1* | 3/2016 | Hung | G03F 7/70633 355/67 |
| 2018/0173110 A1* | 6/2018 | Hu | G03F 7/705 |
| 2018/0299795 A1* | 10/2018 | Tyminski | G06T 7/73 |
| 2019/0146357 A1* | 5/2019 | Wang | G03F 7/70633 |

\* cited by examiner

BASELINE OVERLAY CONTROL WITH RESIDUAL NOISE REDUCTION

BACKGROUND

The present invention relates in general to semiconductor manufacture, and more particularly, to systems and methods for determining overlay error and correction in the manufacture of semiconductor devices by lithographic techniques using a lithographic apparatus.

Semiconductor device manufacturing involves depositing multiple layers of patterned materials on a substrate. All of these multiple patterned layers must be aligned correctly in order for any of the devices to operate properly. Any variations in alignment are generally referred to as overlay errors, which can be measured using metrology in order to determine whether two layers on a substrate are aligned or not. Minimizing overlay errors is important for achieving high yield and reliability, and for ensuring that devices meet performance specifications. Any devices outside the tolerances for overlay will need to be reworked, which is costly and time consuming.

To build the complex structures that make up a transistor and the many wires that connect the millions of transistors of a circuit, lithography and etch pattern transfer steps are repeated at multiple times. Each pattern being printed on the wafer is aligned to the previously formed patterns and slowly the conductors, insulators, and selectively doped regions are built up to form the final device. A typical semiconductor device can include twenty to thirty levels of patterned layers. The placement of the patterned features on a given level must match the placement of corresponding features on other levels within an accuracy that is some fraction of the minimum feature size or critical dimension (CD). Generally, as the device features scale downwards and pattern density increases, overlay error budgets also shrink. Because of this, conventional multi-exposure and multi-patterning schemes require very tight overlay error budgets. In conventional lithographic systems, various alignment mechanisms are provided to align features in a given layer to the features in an underlying layer. For advanced nodes, however, optical or extreme ultraviolet (EUV) scanner improvements alone do not reduce the overlay error enough to meet the required specifications.

SUMMARY

Systems and methods for determining overlay error and correction in the manufacture of semiconductor devices by lithographic techniques using a lithographic apparatus are described herein. A non-limiting example of a method of using a control module to control a scanning/stepping function of a lithographic apparatus in accordance with one or more aspects of the present invention includes exposing a first layer on a wafer and measuring first overlay vectors of alignment registration marks at multiple locations relative to alignment registration marks of a baseline reference. The first layer is exposed a second time and second overlay vectors are measured relative to the alignment registration marks of the baseline reference. The second overlay vectors are subtracted from the first overlay vectors to obtain overlay vector differences at each of the multiple locations within the first layer. A first pre-correction factor based on the overlay vector differences to the scanning/stepping function is applied, wherein the pre-correction factor has a magnitude of an opposite sign to the overlay vector difference at each of the multiple locations. The second layer is exposed using the first pre-correction factor.

A non-limiting example of a computer program stored on a machine-readable medium, and including instructions for exercising control over a lithographic apparatus so as to perform a method in accordance with one or more aspects of the present invention includes projecting a first patterned radiation beam as a pattern image onto a first layer on a substrate along a scan path, the scan path being defined by a trajectory in a scanning direction of an exposure field. First overlay vectors of alignment registration marks are measured at multiple locations relative to alignment registration marks of a baseline reference. The first layer is reworked by removing the first layer and redepositing the first layer onto the substrate. The first patterned radiation beam is projected as the pattern image onto the reworked first layer along the scan path. Second overlay vectors are measured at multiple locations relative to the alignment registration marks of the baseline reference. The second overlay vectors are subtracted from the first overlay vectors to obtain overlay vector differences at each of the multiple locations within the first layer. A first pre-correction factor is calculated based on the overlay vector difference, wherein the first pre-correction factor has a magnitude of an opposite sign to the overlay vector differences at each of the multiple locations. A second patterned radiation beam is projected as a pattern image onto a second layer on a substrate along the scan path, wherein the first pre-correction factor is applied to the patterned radiation beam to provide a vector by vector correction at each of the multiple locations.

A non-limiting example of a system for enhanced overlay control by residual noise reduction in accordance with one or more aspects of the present invention includes an overlay metrology tool in communication with a scanner stability module to control a scanning/stepping function of a lithographic apparatus. The overlay metrology tool is configured to calculate a positional offset of an alignment registration mark in a first layer, wherein the positional offset is an overlay vector difference calculated by subtracting first overlay vectors of alignment registration marks measured at multiple locations in the first layer relative to alignment registration marks of a baseline reference from second overlay vectors measured at the multiple locations in a reworked first layer relative to the alignment registration marks in the baseline reference. The positional offset provides a vector by vector correction at each of the multiple locations.

DETAILED DESCRIPTION

Figure 1:
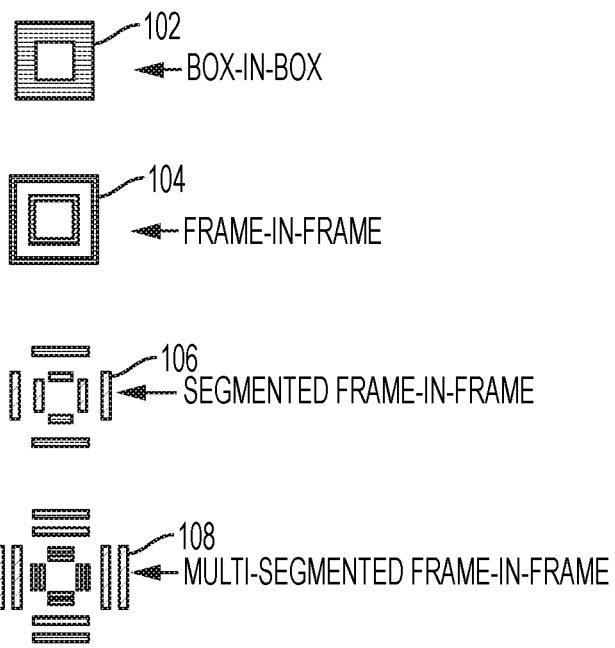
FIG. 1 is a schematic showing typical overlay patterns or completed alignment attributes.

The fabrication of an integrated circuit (IC) requires a variety of physical and chemical processes performed on a semiconductor (e.g., silicon) substrate using a lithographic apparatus, which is a machine that applies a desired pattern onto a substrate, usually onto a target portion of the substrate. In that instance, a patterning device, which is alternatively referred to as a "mask" or a "reticle," can be used to generate a desired circuit pattern to be formed on an individual layer of the IC. This pattern can be transferred onto the target portion (e.g., including part of, one, or several dies) on a substrate (e.g., a silicon wafer). Transfer of the pattern is typically via imaging onto a layer of radiation-sensitive material (e.g., a photoresist) provided on the substrate. However, before the exposure of the photoresist with an image of the mask can begin, this image must be aligned with the previously defined patterns on the wafer. This alignment, and the resulting overlay of the two or more lithographic patterns, is critical because tighter overlay control means circuit features can be packed closer together. Closer packing of devices through better alignment and overlay is nearly as critical as smaller devices through higher resolution in the drive towards more functionality per chip.

In general, a single substrate will contain a network of adjacent target portions that are successively patterned. Known lithographic apparatus include so-called steppers, in which each target portion is irradiated by exposing an entire pattern onto the target portion at one time, and so-called "scanners," in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, the overlay error between successive layers formed in or on the patterned substrate is measured. This measurement can be performed on a product substrate and/or on a dedicated metrology target, e.g., a golden wafer. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometers are known. Spectroscopic scatterometers direct a broadband radiation beam onto the substrate and measure the spectrum (intensity as a function of wavelength) of the radiation scattered into a particular narrow angular range. Angularly-resolved scatterometers use a monochromatic radiation beam and measure the intensity of the scattered radiation as a function of angle.

The effects of overlay error are typically divided into two major categories for the purpose of quantifying overlay error and making precise exposure adjustments to correct the problem. The first category, referred to as grid or inter-field error, is the positional shift and rotation of each exposure pattern, exposure field, or simple field, with reference to the nominal center position of the wafer. These global or inter-field positional errors can be caused by the wafer stage subsystem of the photolithographic exposure tool. Overlay modeling algorithms typically divide grid or inter-field error into various sub-categories or components the most common of which are translation, rotation, magnification or scale, non-orthogonality, stage distortion and stage rotation. In order to measure and quantify the overlay error that exists between device layers special overlay target patterns can be printed in designed locations across the wafer at each lithographic processing step. If the two patterned layers are perfectly aligned to each other the overlay target patterns will be aligned with each other. Any positional offset or misalignment is a measure of the overlay error.

The second category, intra-field overlay error, is the positional offset of an individual point inside an exposure field referenced to the nominal center of an individual exposure field.

Figure 2:
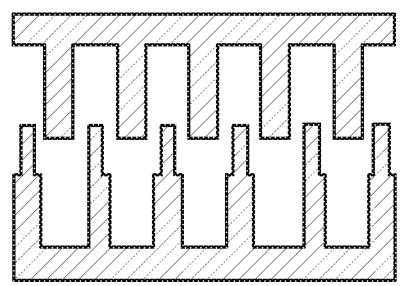
FIG. 2 is a schematic showing typical optical verniers.

FIG. 1 shows a variety of different overlay target patterns. There are many types of alignment attributes or overlay target patterns, for example, a box-in-box 102, a frame-in-frame 104, a segmented frame-in-frame 106, and a multi-segmented frame-in-frame 108 as shown in FIG. 1, optical verniers as shown in FIG. 2, gratings, and the like. The positional offset of these different target patterns can be periodically measured from a baseline reference with a commercial optical overlay metrology tool and passed to a scanner stability module such as Baseliner™ manufactured by ASML in The Netherlands.

The Baseliner scanner stability is configured to automatically reset the lithographic system to a pre-defined baseline. To do this BaseLiner retrieves standard measurements taken on a monitor wafer using a metrology tool. Finding the relative magnitude of wafer stage placement error is determined using a process that includes creating and using a "golden wafer", i.e., a baseline reference wafer. Using the golden wafer, the wafer stage placement error can be measured semi-independent of other sources of registration error. Semiconductor manufacturing facilities typically use the resulting placement error information to manually or automatically adjust the wafer stage and alignment system in such a way so as to minimize the impact of overlay error. However, as noted above, although the scanner is optimized prior to exposure, the systematic variations across the wafer due to wafer processing in the overlay mark registration are found within each golden wafer.

Figure 3:
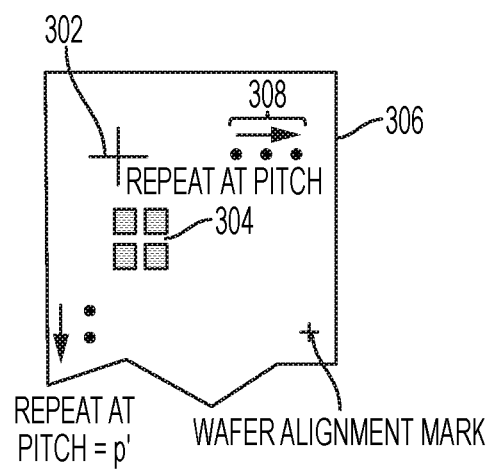
FIG. 3 is a schematic showing a reticle.

FIG. 3 shows a typical set of geometrically placed overlay target patterns consisting of a matching pair of male 302 and female targets 304. The male 302 and female 304 targets can be regularly spaced across a wafer stage test reticle 306 as shown in FIG. 3.

Figure 5:
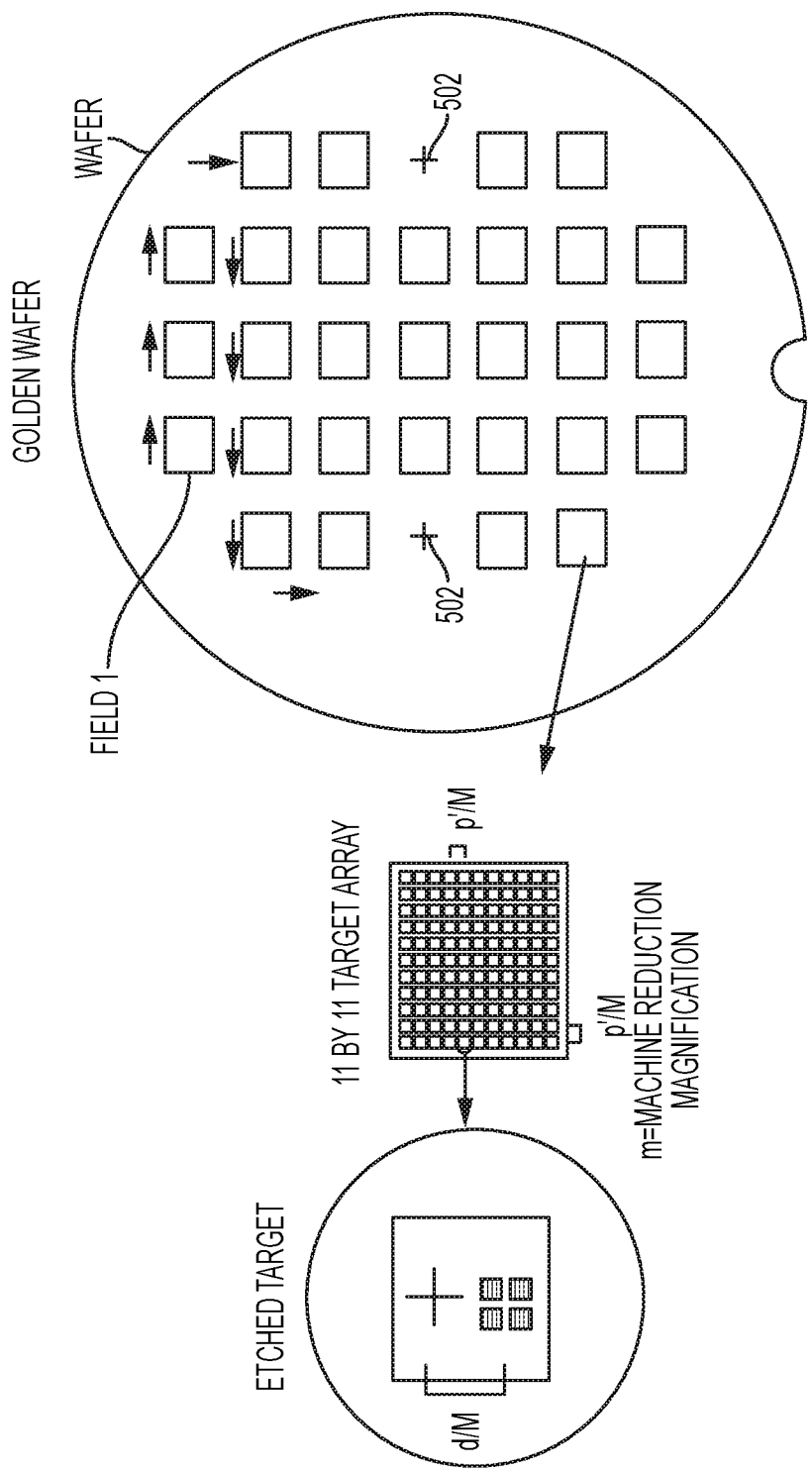
FIG. 5 is a schematic showing an exemplary golden wafer.
Figure 6:
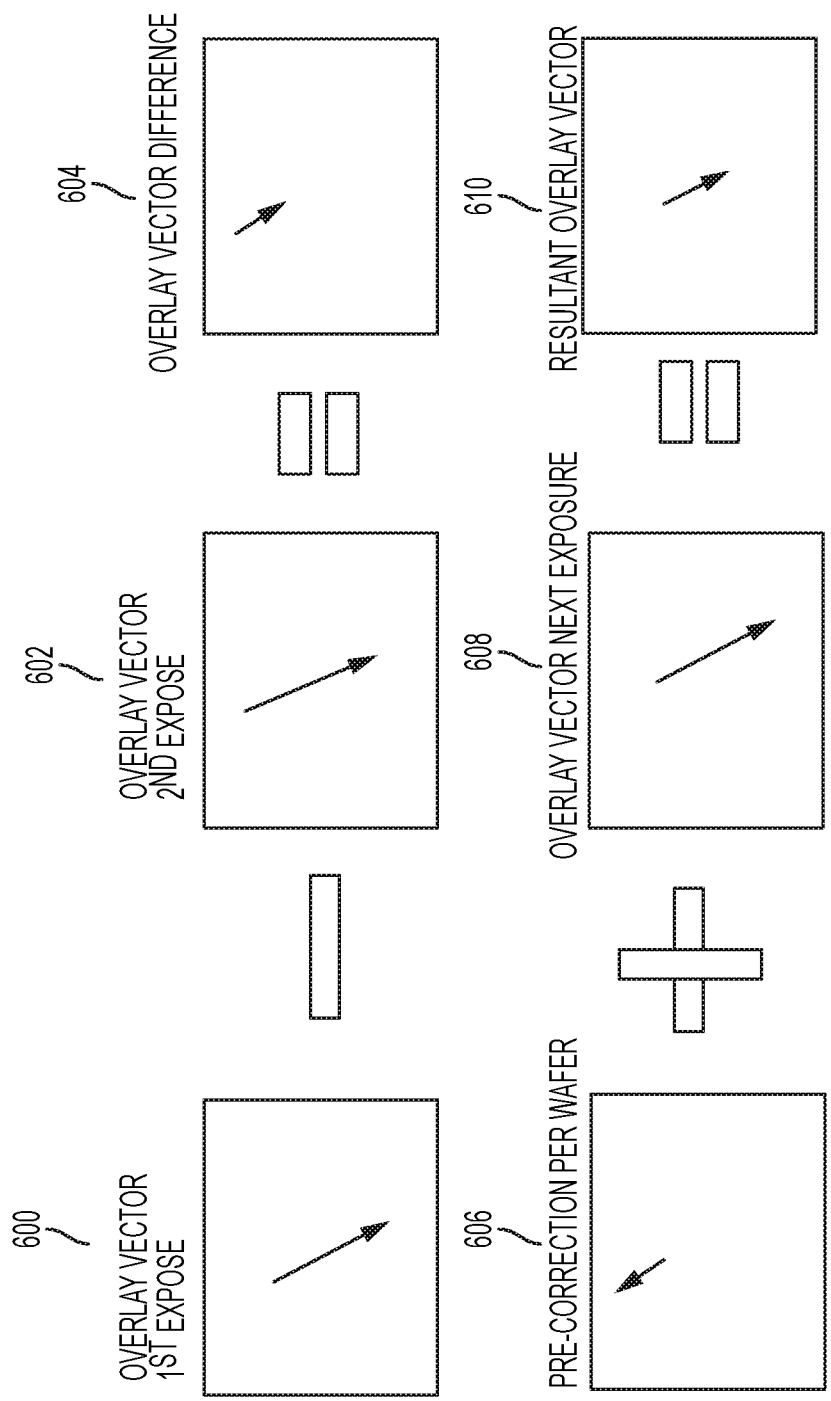
FIG. 6 schematically illustrates an overlay vector by vector subtraction process for noise reduction in accordance with one or more embodiments of the present invention.

It should be noted that typically the target patterns on most reticles are 4 or 5 times larger as compared with the patterns they produce at the image plane, this simply means modern semiconductor projection imaging tools are reduction systems. Further, (by measuring the reticle and then applying these corrections) the overlay target patterns are placed in nearly perfect geometric positions on the wafer stage test reticle. For example, first, a photoresist coated wafer is loaded onto an exposure tool or stepper wafer stage and globally aligned. Next, the full-field image of the reticle is exposed several times at various positions across the surface of the photoresist coated wafer as illustrated in FIG. 5. In addition, several wafer alignment registration marks 502 can also be printed across the wafer using the reticle as illustrated in FIGS. 3 and 6. For example, the full-field of the reticle 306 can consist of an 11 by 11 array of male 302 and female 304 targets evenly spaced at pitch p' 308, across the reticle surface [FIG. 3]. The pattern is then sent through the remaining portions of the lithographic patterning process to delineate the resist pattern. Finally, the patterned wafer is etched and the alignment attributes are permanently recorded in the wafer surface. This permanently etched wafer is called a golden wafer.

Figure 4:
FIG. 4 is a schematic showing overlapped male and female target pairs.

In general, the golden wafer can be used to extract stage errors on any photolithographic exposure tool in the following way. The golden wafer is loaded onto the wafer stage in question and aligned into position using the previously placed wafer alignment marks 502 illustrated in FIG. 6. Next, the wafer stage is moved so as to align the reticle 306 illustrated in FIG. 3 containing, for example, an 11 by 11 array of male targets 302 directly on top of the first full-field exposure pattern containing an 11 by 11 array of female 304 targets resulting in overlapping targets 402 as illustrated in FIG. 4 [FIGS. 4, 6]. Making these overlapping targets involves shifting the wafer the small increment d/M so male and female targets lie on top of one another. When the stepper has finished the alignment procedure the x, y wafer stage coordinates and overlay error associated with several male-female targets is electronically recorded. This step, align and record procedure is repeated across a desired portion of the wafer for each full-field 11 by 11 exposure pattern. The electronically recorded target coordinates and overlay errors can then be entered into a statistical modeling algorithm to calculate the systematic and random components of inter-field and intra-field overlay error. It is important to note that the resulting inter-field or wafer stage overlay error not yield the unique overlay error of the wafer stage in question. Rather, it can only be used to report the inter-field or wafer stage overlay error as referenced to a golden wafer that was produced on another reference machine. In general, semiconductor manufacturers always rely on some kind of stage matching or cross-referencing technique to calculate the relative wafer stage overlay error.

Figure 10:
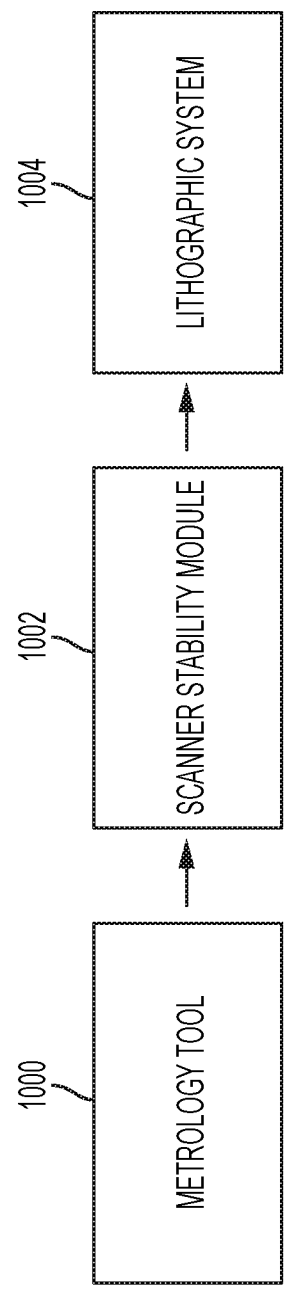
FIG. 10 schematically illustrates a system for enhanced overlay control by residual noise reduction in accordance with one or more embodiments of the present invention.

The scanner stability module 1002 retrieves standard measurements taken from the golden wafers using a metrology tool 1000 as shown in FIG. 10. Each reference wafer had been previously exposed using a special reticle containing special scatterometry marks. Using the golden wafer and that day's measurements (and possibly historical measurement data from previous days), the scanner stability module determines how far the lithographic system 1004 has drifted from its baseline, and then calculates wafer-level overlay and focus correction sets. The baseline can be defined either directly by a reference layer on the golden wafer (in this case, the scanner stability module will drive the system towards minimal overlay on the baseline monitor wafers) or indirectly by a combination of the reference layer on the wafers and a target overlay fingerprint (in this case, the scanner stability module will drive the system towards the defined target overlay fingerprint on the wafers). The lithography system 1004 then converts these correction sets into specific corrections for each exposure on subsequent production wafers.

The alignment model sequences produce a significant noise source for the scanner stability module controller, which attempts to control the scanner using overlay data from a very limited number of golden wafers (typically from 4 to 12 wafers per week for each scanner). Moreover, improvement of the overlay control of the scanner module 1002 can be limited by the baseline overlay variation ($3\sigma$). Although care is taken in the production of the golden wafers, systematic variations across the wafer due to wafer processing in the overlay mark registration are found within each reference wafer. Additionally, there is wafer-to-wafer variation of the overlay.

To address these issues, one could always use the same golden wafer, which would eliminate any wafer-to-wafer mark registration variations. However, mark registration variations within wafer would still add to the overlay budget. Moreover, the logistics of maintaining the availability of a single golden wafer within a fab is problematic and not practical. A limited set of golden wafers could be utilized so as to provide the capability of applying model based pre-corrections (i.e., grid, intra-field liner and high order corrections) on a per wafer basis, which would eliminate wafer-to-wafer mark registration variation. However, the per wafer corrections would only partially reduce the wafer noise as residuals would still contribute to the overlay error.

In one or more embodiments of the present invention, residuals associated with wafer mark variation can be reduced by vector- by-vector overlay error subtraction at each location in the field (across the wafer) from a prior reference wafer to the same current wafer. Vector displacement plots provide a visual description of the direction and magnitude of overlay error, which are mathematically separated into different spatial components using a variety of regression routines. There are many commercial software packages that can be used to model and statistically determine the intra-field error components for the purpose of process control and exposure tool set-up. Once determined, the intra-field error components are analyzed and used to adjust calibration constants of the wafer handling stage to improve pattern alignment. In addition, because different exposure tools are used to produce a given device the exposure tools must be matched or fingerprinted and adjusted so that registration errors unique to one tool are removed or minimized as much as possible.

As such, the overlay vectors for a given wafer are measured relative to the marks within a reference wafer and then reworked and measured a second time to produce an overlay vector difference upon subtraction of the first overlay vector from the second overlay vector. The resulting overlay vector difference, i.e., the noise, can be used to provide a pre-correction vector per wafer of an opposite magnitude for processing a second layer. The pre-correction vector can then be added to the overlay vector of the next exposure to produce a resultant overlay vector. The resulting overlay corrections can then be added to the wafer stage placement error, i.e., the baseliner correction as discussed above, to reduce the residual mean overlay and residual overlay variation of overlay, e.g., a 30% reduction in $3\sigma$.

Advantageously, the system and methods in accordance with the present invention reduce the noise from mark registration from wafer to wafer and from mark registration across the wafer. The noise reduction can be applied to all scanners with the baseline control including, but not limited to optical to optical, optical to EUV, and EUV to EUV.

Accordingly, embodiments of the present invention provide systems and methods for enhanced overlay control by residual noise reduction in addition to the baseline control provided by the use of golden wafers. More particularly, embodiments of the invention generally include vector by vector overlay error subtraction at each location within a given field across the wafer from a prior reference wafer to the same current wafer so as to reduce wafer mark variation. In this manner, noise is reduced by vector-to-vector error correction from mark registration from wafer-to-wafer as well as across the wafer.

The embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc. Before describing such embodiments in more detail, however, it is instructive to present example environments in which embodiments of the present invention can be implemented.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, an article or apparatus that includes a list of elements is not necessarily limited to only those elements but can include other elements not expressly listed or inherent to such article or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

It should be noted that not all masking, patterning, and lithography processes are shown, because a person of ordinary skill in the art would recognize where masking and patterning processes are utilized to form the identified layers and openings, and to perform the identified selective etching processes, as described herein.

Turning now to the Figures, FIG. 6, vector by vector overlay error subtraction at a specific location in a field (which can be applied to multiple locations across the wafer) is demonstrated, which can be added to the wafer stage correction determined with a golden wafer so as to further reduce wafer mark variation. The vector by vector overlay error subtraction method generally includes determining an overlay vector of a mark registration subsequent to a first exposure of a photoresist on a reference wafer as indicated in step 600. The overlay vector of the mark registration can be determined relative to a previously processed wafer or the golden wafer. The reference wafer is then reworked to remove the photoresist and redeposit the photoresist under the same parameters and a second exposure is made. A second overlay vector is the measure relative to the same processed wafer or the golden wafer as indicated in step 602. The second overlay vector is then subtracted from the first overlay vector to provide an overlay vector difference as shown in step 604. The overlay vector difference is representative of the wafer to wafer noise at the same field location. A pre-correction vector is then determined from the overlay vector difference, which is a vector of an opposite magnitude as the overlay vector difference as shown in step 606. The pre-correction vector to the next exposure of an additional layer as indicated in step 608 to provide a resultant overlay vector on the additional layer, which represents the real overlay vector without the wafer to wafer noise as shown in step 610.

Because a lithographic apparatus will drift as a function of time, the noise can be removed real time by subtracting the overlay vector after a second exposure at the same location in the field.

Figure 9:
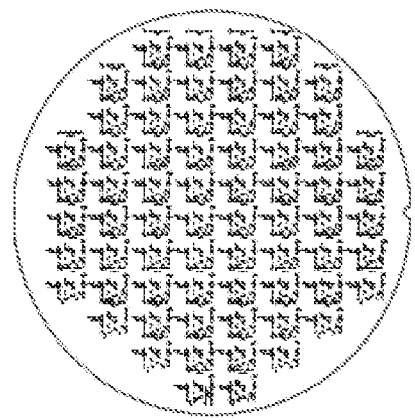
FIG. 9 schematically illustrates an overlay vector displacement differential pattern subsequent to subtraction of the second overlay vector displacement pattern from the fist overlay vector displacement pattern in accordance with one or more embodiments of the present invention.
Figure 8:
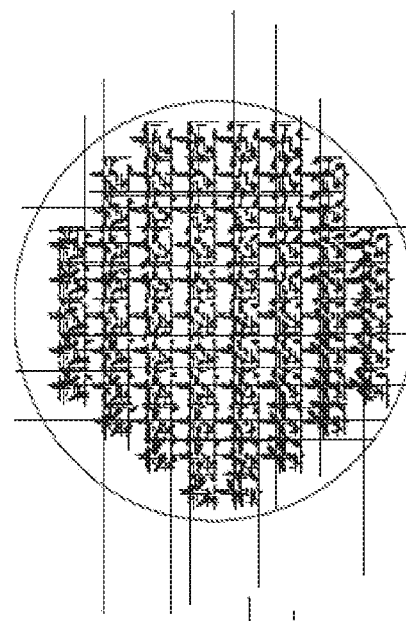
FIG. 8 schematically illustrates a second overlay vector displacement pattern of a reworked first layer at multiple locations on the wafer relative to the baseline reference in accordance with one or more embodiments of the present invention.
Figure 7:
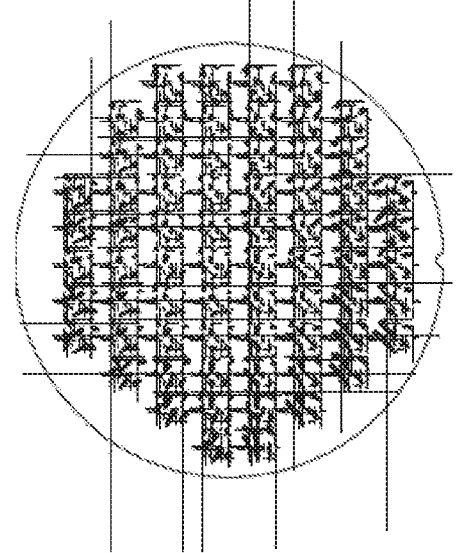
FIG. 7 schematically illustrates a first overlay vector displacement pattern of a first layer at multiple locations on a wafer relative to a baseline reference in accordance with one or more embodiments of the present invention.

FIGS. 7-9 depict vector displacement plots of various dies on a wafer as a function of first exposure and overlay measurement relative to a golden wafer, rework of the same wafer and second exposure and overlay measurement, and subtraction of the second overlay measurement to provide the overlay vector difference between the two exposures. FIG. 7 schematically illustrates the vector displacement plot after the first exposure relative to the golden wafer. FIG. 8 schematically illustrates the vector displacement plot after rework of the same wafer and wafer the second exposure relative to the same golden wafer or a preceding wafer. FIG. 9 schematically illustrates the vector displacement plot after subtracting the second vector displacement plot from the first vector displacement plot.

Figure 11:
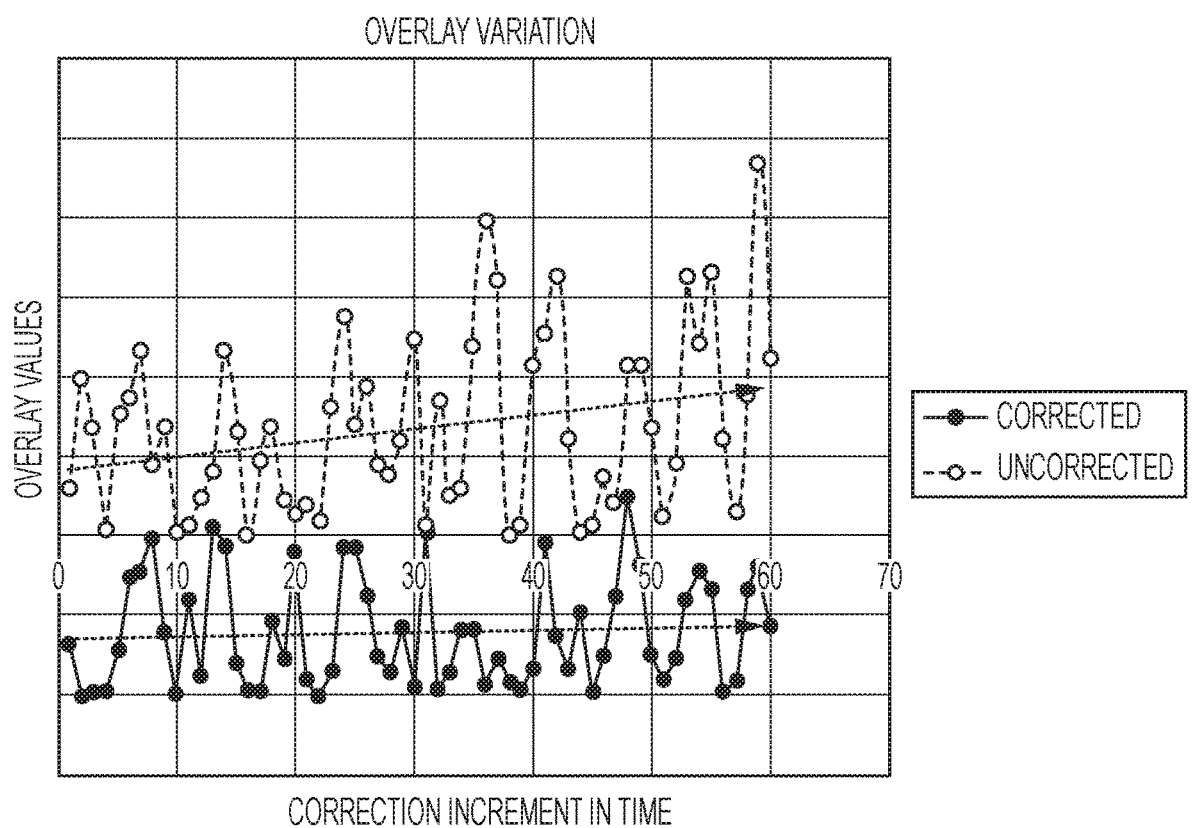
FIG. 11 graphically illustrates mean overlay and variation of overlay with and without vector by vector subtraction in accordance with one or more embodiments of the present invention.

FIG. 11 graphically illustrates the 3σ overlay data with and without vector subtraction. The graph illustrates the mean overlay of the same set of wafers using the vector by vector overlay subtraction method as described above. It is clearly shown that not only is the mean overly larger for the mixed sets without vector by vector error correction but the variation of overlay is significantly larger relative to vector by vector error correction of the same sets, wherein about a 30 percent reduction in 3σ was observed.

In summary, each etched primary layer will have an overlay signature that varies from baseliner wafer to wafer. The overlay pre-corrections will be applied to each wafer. Consequently, the vector by vector subtraction reduces the systematic noise of the primary layer for each etched baseliner control wafer.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The present invention can be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the Figures. For example, two blocks shown in succession may, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of using a control module to control a scanning/stepping function of a lithographic apparatus, the method comprising:
   exposing a first layer on a wafer and measuring first overlay vectors of alignment registration marks at multiple locations relative to alignment registration marks of a baseline reference wafer;
   reworking and exposing the first layer a second time and measuring second overlay vectors relative to the alignment registration marks of the baseline reference wafer;
   subtracting the second overlay vectors from the first overlay vectors to obtain overlay vector differences at each of the multiple locations within the first layer;
   applying a first pre-correction factor based on the overlay vector differences to the scanning/stepping function, wherein the pre-correction factor has a magnitude of an opposite sign to the overlay vector difference at each of the multiple locations; and
   exposing the second layer.

2. The method of claim 1, wherein exposing the first layer comprises applying a photoresist layer thereon and exposing the first layer comprises applying an activating radiation beam to form a pattern in the photoresist layer, wherein the pattern includes one or more alignment registration marks.

3. The method of claim 1, wherein exposing the first layer a second time comprises reworking the first layer by removing the first layer and reapplying the first layer onto the wafer.

4. The method of claim 1 further comprising adding the first pre-correction factor to a wafer stage correction factor applied to each of the exposures, wherein the wafer correction factor comprises grid, intra-field liner, and higher order corrections.

5. The method of claim 1, wherein the first and second overlay vectors are measured within multiple dies located across the wafer.

6. The method of claim 1, wherein the baseline reference comprises a primary layer underlying the first layer.

7. The method of claim 1, wherein the baseline reference comprises a golden wafer.

8. The method of claim 1, wherein subsequent to exposing the second layer third overlay vectors of alignment registration marks are measured at multiple locations in the second layer relative to the alignment registration marks of the first layer.

9. The method of claim 8 further comprising exposing the second layer a second time and measuring a fourth overlay vector relative to the alignment registration marks in the first layer; subtracting the fourth overlay vectors from the third overlay vectors to obtain overlay vector differences at each of the multiple locations within the second layer; applying a second pre-correction factor based on the overlay vector difference to the scanner stepper function, wherein the second pre-correction factor has a magnitude of an opposite sign to the overlay vector differences at each of the multiple locations; and exposing a third layer.

10. The method of claim 1, wherein exposing the second layer a second time comprises reworking the second layer by removing the second layer and reapplying the second layer onto the wafer.

11. A non-transitory computer program stored on a machine-readable medium, and including instructions for exercising control over a lithographic apparatus so as to perform a method, comprising:
   projecting a first patterned radiation beam as a pattern image onto a first layer on a substrate along a scan path, the scan path being defined by a trajectory in a scanning direction of an exposure field;
   measuring first overlay vectors of alignment registration marks at multiple locations relative to alignment registration marks of a baseline reference wafer;
   reworking the first layer by removing the first layer and redepositing the first layer onto the substrate;
   projecting the first patterned radiation beam as the pattern image onto the reworked first layer along the scan path;
   measuring second overlay vectors at multiple locations relative to the alignment registration marks of the baseline reference wafer;
   subtracting the second overlay vectors from the first overlay vectors to obtain overlay vector differences at each of the multiple locations within the first layer;
   calculating a first pre-correction factor based on the overlay vector difference, wherein the first pre-correction factor has a magnitude of an opposite sign to the overlay vector differences at each of the multiple locations; and
   projecting a second patterned radiation beam as a pattern image onto a second layer on a substrate along the scan path, wherein the first pre-correction factor is applied to the patterned radiation beam to provide a vector by vector correction at each of the multiple locations.

12. The non-transitory computer program of claim 11, wherein the first layer comprises a photoresist layer, and wherein the pattern image includes one or more alignment registration marks.

13. The non-transitory computer program of claim 11 further comprising adding the first pre-correction factor to a wafer stage correction factor applied to the second patterned radiation beam, wherein the wafer correction factor comprises grid, intra-field liner, and higher order corrections.

14. The non-transitory computer program of claim 11, wherein the baseline reference comprises a primary layer underlying the first layer.

15. The non-transitory computer program of claim 11, wherein the baseline reference comprises a golden wafer.

16. The non-transitory computer program of claim 11 further comprising reworking the second layer; projecting the second patterned radiation beam as the pattern image onto the reworked second layer and measuring third overlay vectors of alignment registration marks relative to the alignment registration marks in the first layer.

17. A system for enhanced overlay control by residual noise reduction, the system comprising:

an overlay metrology tool in communication with a scanner stability module to control a scanning/stepping function of a lithographic apparatus, wherein the overlay metrology tool is configured to calculate a positional offset of an alignment registration mark in a first layer, wherein the positional offset comprises an overlay vector difference calculated by subtracting first overlay vectors of alignment registration marks measured at multiple locations in the first layer relative to alignment registration marks of a baseline reference wafer from second overlay vectors measured at the multiple locations in a reworked first layer relative to the alignment registration marks in the baseline reference, wherein the positional offset provides a vector by vector correction at each of the multiple locations.

18. The system of claim 17, wherein the positional offset further includes a wafer stage correction factor.

19. The system of claim 17, wherein the lithographic apparatus comprises an extreme ultraviolet (EUV) scanner.

* * * * *